United States Patent [19]
Adams

[11] Patent Number: 5,532,192
[45] Date of Patent: *Jul. 2, 1996

[54] METHOD OF SPIRAL RESIST DEPOSITION

[75] Inventor: Thomas E. Adams, Emmaus, Pa.

[73] Assignee: AT&T Corp., Murray Hill, N.J.

[ * ] Notice: The term of this patent shall not extend beyond the expiration date of Pat. No. 5,395,803.

[21] Appl. No.: 355,757

[22] Filed: Dec. 14, 1994

Related U.S. Application Data

[63] Continuation of Ser. No. 118,538, Sep. 8, 1993, Pat. No. 5,395,803.

[51] Int. Cl.⁶ .................................................. H01L 21/312
[52] U.S. Cl. ............................ 437/229; 437/240; 118/52
[58] Field of Search .................................. 437/229, 240; 118/52

[56] References Cited

U.S. PATENT DOCUMENTS

| | | | |
|---|---|---|---|
| 3,198,657 | 8/1965 | Kimball et al. | 437/229 |
| 4,267,212 | 5/1981 | Sakawaki | 427/240 |
| 4,451,507 | 5/1984 | Beltz et al. | 427/240 |
| 5,094,884 | 3/1992 | Hillman | 427/240 |

FOREIGN PATENT DOCUMENTS

| | | | |
|---|---|---|---|
| 454314A2 | 8/1991 | European Pat. Off. | G03F 7/16 |
| 072378 | 7/1981 | United Kingdom | G11B 7/26 |
| WO-A-9011837 | 10/1990 | WIPO | B05D 3/06 |

OTHER PUBLICATIONS

Method For Coating Photoresist Patent Abstracts of Japan vol. 7, No. 70 (P-185) (1215) 23 Mar. 1983.
E-388 (2122) Patent Abstracts of Japan vol. 10, No. 65. 14 Mar. 1986.
Patent No. Patent Abstracts of Japan, issued in Japan on 27 Jul. 1988 to Hiroki Nezu.

Primary Examiner—Tom Thomas
Assistant Examiner—Lynn A. Gurley
Attorney, Agent, or Firm—John T. Rehberg

[57] ABSTRACT

A method of depositing a material upon a substrate is disclosed. A material, such as photoresist, is deposited upon a substrate such as a semiconductor wafer by spinning the substrate and commencing deposition at the edge of the wafer and moving inward in a spiral pattern. The method produces a more uniform coating than hitherto available.

7 Claims, 3 Drawing Sheets

METHOD OF SPIRAL RESIST DEPOSITION

This is a division of application Ser. No. 08/119,538 filed Sep. 8, 1993 now U.S. Pat. No. 5,395,803.

TECHNICAL FIELD

This invention relates to processes for the deposition of coatings upon substrates, in general, and more particularly to methods for semiconductor integrated circuit fabrication utilizing the deposition of resist-type materials upon semiconductor substrates.

BACKGROUND OF THE INVENTION

A variety of modern technologies rely upon the precise deposition of a liquid material upon a solid substrate. Although it is frequently desirable to obtain a precisely uniform coating, methods for achieving such uniformity are often elusive.

A particular example is the semiconductor industry, in which resist materials (often photoresist materials) are deposited upon semiconductor wafers. The resist materials are subsequently exposed to light through a reticle and then portions of the resist are removed so that underlying portions of the substrate may be exposed to, for example, etchant or dopant species.

Conventional methods for applying photoresist involve the placement of a semiconductor wafer upon a chuck in a chamber. An arm having a dispensing tube at its end is positioned generally over the center of the wafer. A pump connected to the arm is activated and a puddle of photoresist is dumped onto the center of the wafer while it spins at a slow speed. Then the wafer is spun at a considerably faster speed. Centrifugal force tends to force the photoresist to move outward toward the edge of the wafer while surface tension and viscosity effects control the flow over the surface and the wafer edge boundary conditions. Eventually the entire wafer is coated with photoresist.

The conventional approach presents a variety of problems. First, a considerable amount of photoresist material is wasted. It is necessary to dump more photoresist onto the center of the wafer than is ultimately desired upon the surface of the finished wafer. Considerable excess photoresist is spun off the sides during the "fast spin" cycle of the process. Furthermore, the process typically produces an uneven photoresist coating, not unlike that depicted in FIG. 1. In FIG. 1, reference numeral 11 denotes a semiconductor substrate; while reference numeral 13 denotes a deposited photoresist. In a photoresist having a nominal thickness of approximately 1 µm, the difference between the height of point 17 in the center of the wafer and point 15, at a location intermediate the center and edge of the wafers, may be 100 Å to 200 Å. Unevenness in photoresist layers is undesirable because it will induce variations in the size of critical features (normally placed in the same relative stack location). These variations are due to changes in the coupling of exposure light energy into the photo-active compound (PAC) in the resist. The variation in coupling is caused by the thin film standing wave effects between the top and bottom surfaces of the resist.

Furthermore, the equipment provided by many modern semiconductor manufacturers does not accurately position the dispense stream center over the center of the wafer. The resulting photoresist pattern is sometimes somewhat more complicated than that depicted by FIG. 1 because the initial deposit of photoresist is not in the center of the wafer. However, the resulting pattern has equally undesirable irregularities.

Those concerned with the development of the semiconductor arts as well as other fields in which the formation of coatings of precise thickness is desired have continued to search for methods to alleviate the above-described problems.

SUMMARY OF THE INVENTION

The above-mentioned problems are alleviated by the present invention which includes in an illustrative embodiment a method of coating a substrate which includes spinning the substrate about an axis. Then deposition of a material is commenced near the edge of the substrate and continued in a spiral pattern over the surface of the substrate.

DETAILED DESCRIPTION

Figure 2:
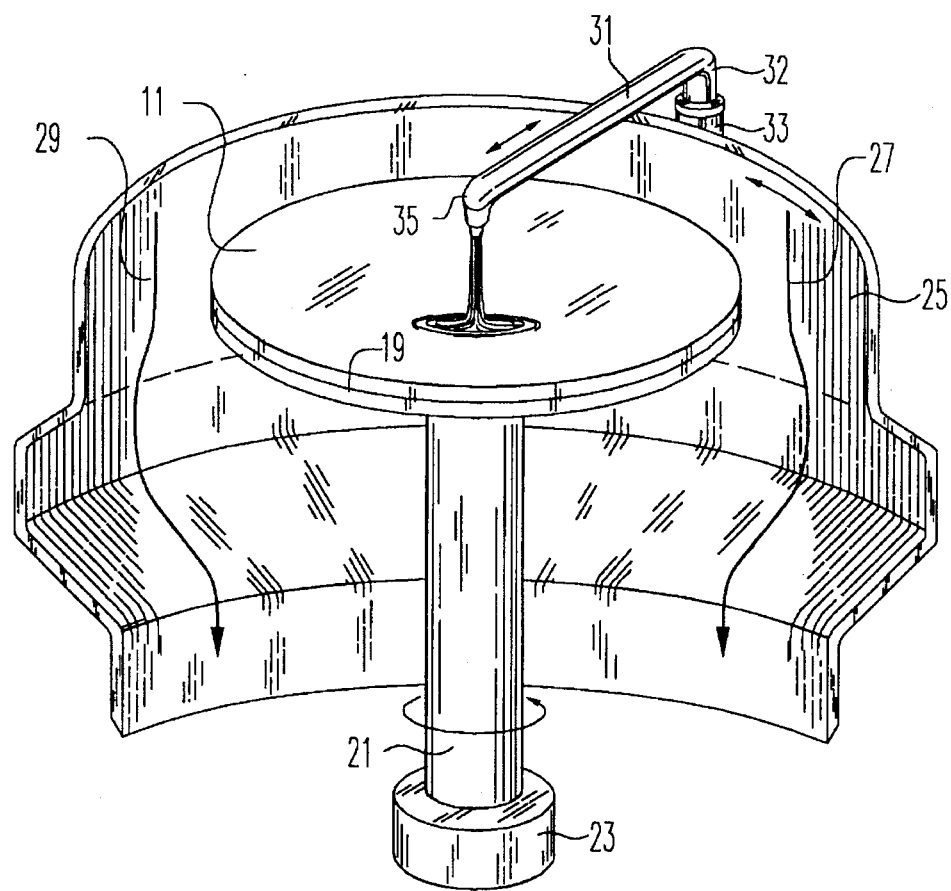
FIGS. 2 and 4 are perspective views useful in understanding an illustrative embodiment of the present invention.

FIG. 2 depicts an apparatus for the deposition of photoresist. Wafer 11 is supported on chuck 19 the center of which is connected to spindle 21. Adjustable motor 23 powers spindle 21 and thereby controls the speed of rotation of wafer 11. Housing 25 encloses wafer 11 and the apparatus associated with coating it. Air stream 29 and 27 is directed downward upon the wafer from a source not depicted. The overall air stream flows across the surface of wafer 11 and down the edge of wafer 11 and, ultimately, below wafer 11. Turbulence and vortices in airflow are also present and are known to affect the coatings.

Dispensing tube 35 is connected to dispensing arm 31 which is powered by pump 33. It is often possible to move arm 31 in a radial or in an arcing motion about its pivot point 32.

Figure 3:
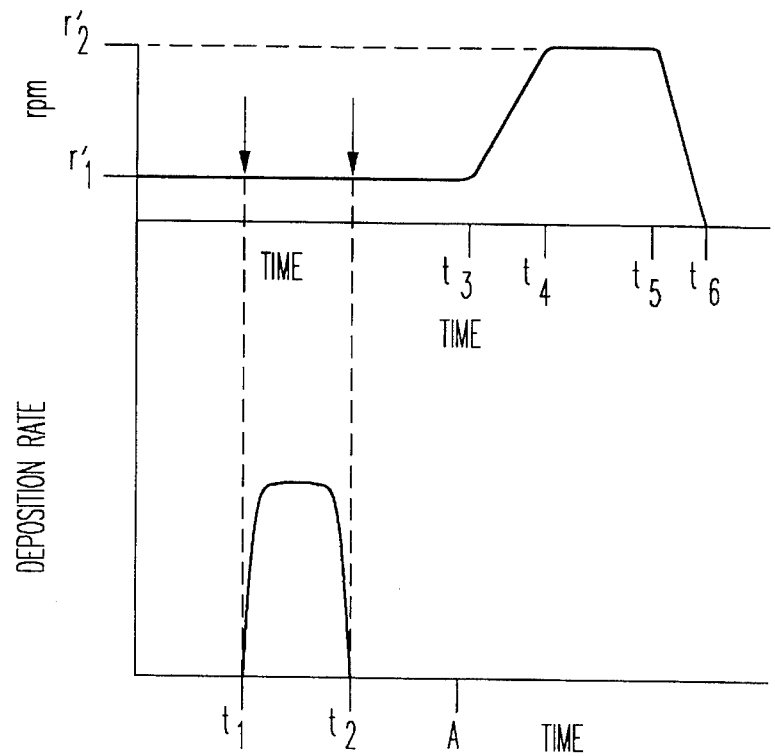
FIGS. 3 and 5 are graphs useful in understanding an illustrative embodiment of the present invention.

FIG. 3 is a graph which depicts the wafer rotational speed together with the deposition rate used in prior practices. It will be noted that as the wafer is spun at an initially moderate speed, $r_1'$ (approximately 800 rpm), an initial volume of resist is dumped onto the wafer between times $t_1$ and $t_2$ ($t_2-t_1 \approx 3\frac{1}{2}$ sec). In conventional practice, the full output (typically 4.5–5 ml) for a 125 mm diameter wafer of the pump 33 (typically a diaphragm pump) is ejected through the dispensing tube in a short, continuous pulse upon the wafer within the time interval $t_2-t_1$. After the resist is dumped upon the approximate center of the wafer, the rotational speed is ramped (at approximately 8 Krpm/sec) between times $t_3$ and $t_4$ to a higher speed, $r_2'$ (approximately 5.6 Krpm). After the period of time corresponding to the time interval $t_4-t_5$ ($t_5-t_4 \approx 15$ sec) has elapsed, and the resist has been permitted to flow to the outer edges of the wafer and beyond, the speed is again abruptly dropped to zero during time interval $t_5-t_6$). (Backside rinsing or edge bead removal steps may also be performed).

The process depicted in FIG. 3, employed in the prior art, utilizes the deposition of a puddle of photoresist at the approximate center of the wafer.

By contrast, applicant's process utilizes the commencement of deposition at the edge of the wafer, a spiral-like deposition proceeding toward the center of the wafer (and possibly then another spiral back toward the edge). For example, in FIG. 4, there is depicted a wafer 11. Deposition commences at point 51 located near the periphery of the wafer. Spiral 53 indicates the approximate position of the center of dispensing tube 35 as it moves inward radially toward center 55 of wafer 11. Of course, spiral 53 is indicative only of the approximate center of dispensing tube 35. The entire wafer surface is generally coated. After dispensing tube 35 is positioned over center 55, it is permitted to travel a bit beyond center, thereby producing tail 57. Then dispensing tube 35 is moved toward the periphery of wafer 11. During this motion the resist is dispensed according to a programmed rate (i.e., volume per unit area traversed) profile (to be discussed subsequently).

Figure 4:
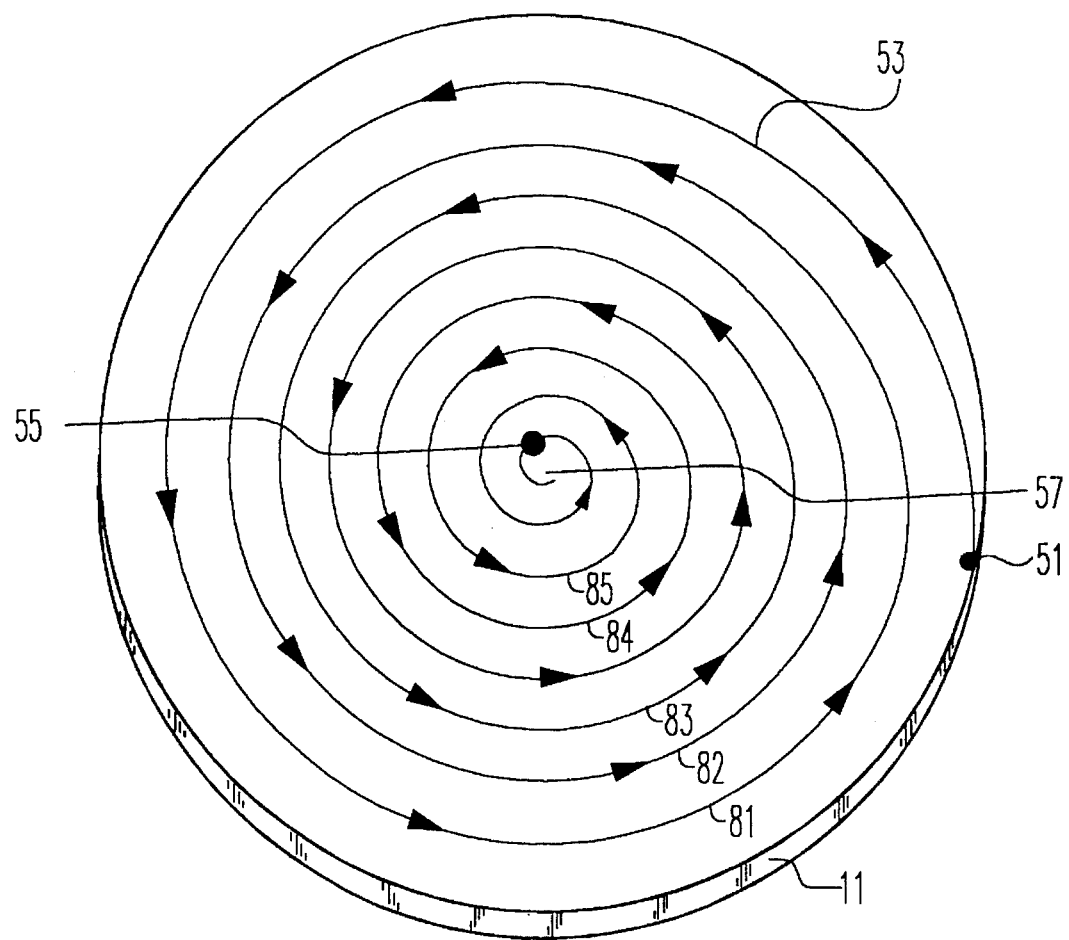

It should be noted in the scheme depicted in FIG. 4 that photoresist dispensation may not terminate when dispensing tube 35 reaches center 55 or even after it creates tail 57. It is often desirable that the photoresist flow is not terminated at either of these points because typical photoresist pumps (despite their suck-back capabilities) may produce drops which are separated from the continuous flow in the flow termination process. The extra drops seem to contribute to the ultimate unevenness of the deposited photoresist and are therefore undesirable. Retracing the spiral, or at least creating another spiral proceeding from past center to the edge of the wafer permits the last drops to fall at either the edge of the wafer (where no integrated circuits will be made) or past the edge of the wafer. The pattern is deliberately designed to move slightly past center 55 to create "tail" 57 so that coverage of the center is assured. Thus, unlike conventional procedures which utilize the deposition of a puddle of photoresist on the center of the wafer and subsequent spinning of the wafer to even out the photoresist, the present procedure utilizes a continuously controlled deposition of photoresist proceeding from the edge of the wafer toward the center, past the center, and then reversing back to the edge of the wafer.

Not only has applicant found that continuously changing the point of deposition upon the wafer produces superior results, but also he has found that changes in the rotational pattern of wafer 11 and the deposition rate are also desirable.

Figure 1:
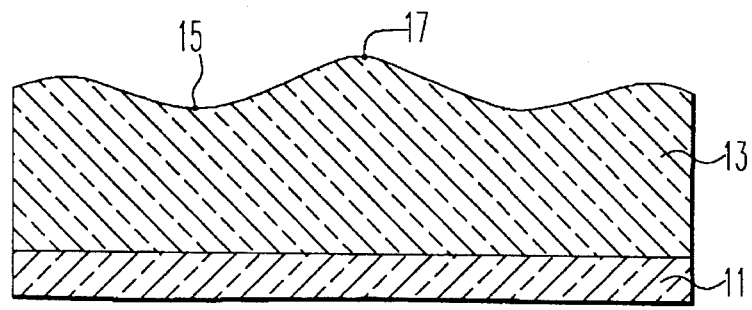
FIG. 1 is a cross-sectional view of a substrate coated with liquid material.
Figure 5:
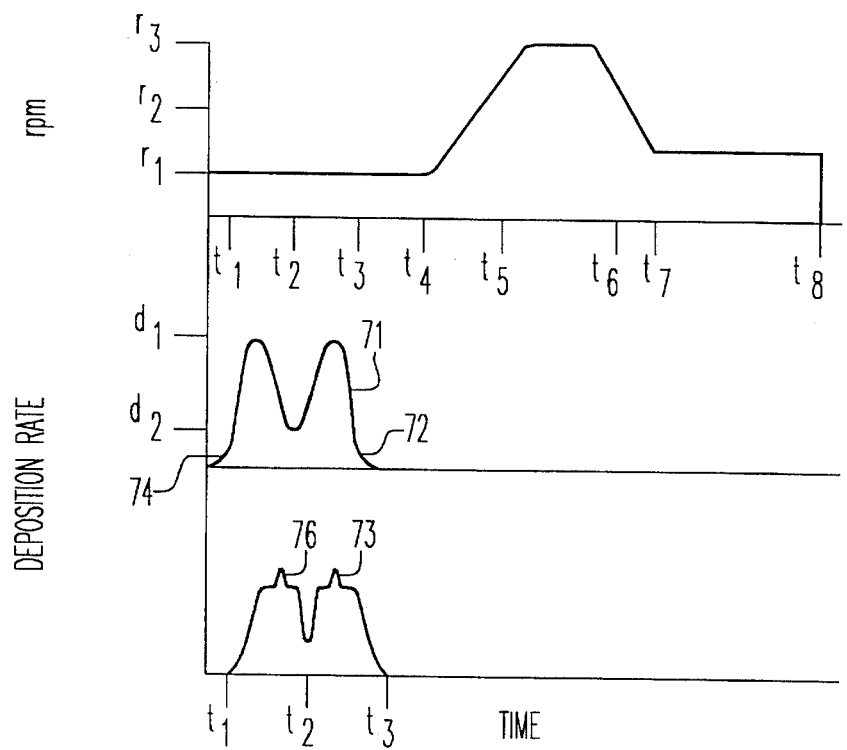

An illustrative embodiment follows. Turning to FIG. 5, it will be noted that the wafer (having a 5" diameter) is initially spun in a speed range $r_1$ which is approximately equal to 30–400 rpm. Between times $t_1$ and $t_3$ ($t_3-t_1 \approx 5$ to 10 sec), the photoresist is deposited upon the entire wafer ($\approx 3\frac{1}{2}$ml is deposited). At times $t_4$, the speed is ramped to speed $r_3$ which is 3–4 Krpm. Between times $t_5$ and $t_6$ ($t_6-t_5 \approx 2$ to 5 sec), the wafer is spun to even out the results of deposition, and set the nominal thickness of the photoresist. Then between times $t_6$ and $t_7$ the speed is reduced back to speed $r_2$ (e.g., 800 rpm –1 Krpm). Then the wafer is spun for an additional period of time equal to approximately 30 sec. The additional spin cycle serves to remove extra solvent at a reduced rate from the photoresist and to further even out the thickness of the photoresist film. Furthermore, applicant has found that, unlike prior practice, it is undesirable to suddenly drop a large amount of photoresist upon the wafer. Consequently, the deposition rate depicted in FIG. 5 may be utilized. For example, curve 71 of FIG. 5 depicts a deposition at a small initial rate at time period $t_1$ while the dispensing tube is positioned over point 51 on the periphery of the wafer to wet the surface and form the initial puddle (deposition commences and stops gradually, as shown by ramps 72 and 74). The deposition rate then smoothly increases to a predetermined value $d_1$ while dispensing tube 35 is traversing relatively large radii of wafer 11. As the radii of the spiral path begin to decrease, the deposition rate may decrease ultimately arriving at a value of $d_2$ near center 55 of wafer 11. Then the cycle is repeated, returning to a deposition rate of approximately $d_1$ as dispensing tube 35 nears the edge of wafer 11 and gradually tapering to zero. The deposition rate depicted by curve 71 of FIG. 5 is, however, not the only one possible. Various circumstances may dictate curves of different shape. For example, it may be desirable to utilize a curve of a general shape of curve 73 to provide slightly greater deposition (corresponding to rate increases at points 76 and 73) at points on the wafer akin to point 15 of FIG. 1 to insure against the creation of insufficient resist at certain points on the wafer. Furthermore, depending upon underlying topography or underlying layers (for example, silicon, phorophosphosilicate glass, aluminum) other deposition rates may be necessary.

Thus, it is desirable that pump 33 have the ability to variably control as a function of time or equivalency (i.e., as a function of dispensing tube position 35 over wafer 11) the amount of photoresist deposited.

The present invention in addition to its other advantages by providing uniform resist, helps to insure subsequent lithographed linewidth uniformity. Thus, the wafer is precoated with resist. The contour of the initially-deposited resist is closer to the desired final contour of the resist. Thus, less resist is wasted in the coating process and additionally less violent spinning of the resist is necessary. This invention helps to alleviate problems caused by differences in resist flow over topographic features having different orientations with respect to the center of the wafer.

The invention may find applicability in the coating of other substrate such as resist coating of quartz (intended for masks or inspection wafers), or resist coating of metallized glass or quartz for flat panel displays.

I claim:

1. A method of semi-conductor integrated circuit fabrication comprising:

spinning a wafer at a speed of $r_1$;

commencing deposition of resist material;

and continuously depositing said resist;

terminating said deposition;

spinning said wafer at a faster speed, $r_3$, for a period of time and further including the step of reducing the spinning speed of said wafer from wafer from $r_3$ to speed $r_2$ where $r_3 > r_2 > r_1$, and continuing to spin said wafer for a period of time.

2. The method of claim 1 in which $r_1$=30–400 rpm.

3. The method of claim 1 in which $r_3$=3–4 Krpm.

4. The method of claim 1 in which $r_2$=800 rpm–1 Krpm.

5. The method of claim 1 in which the deposition rate of said resist is higher near the edge of said wafer than near the center of said wafer.

6. The method of claim 1 in which the rate of said material deposition is variable.

7. The method of claim 1 in which said substrate is circular and has radii, and the rate of said deposition is lower at the center of the said substrate than at the central portion of said radii.

\* \* \* \* \*